Figure 1:
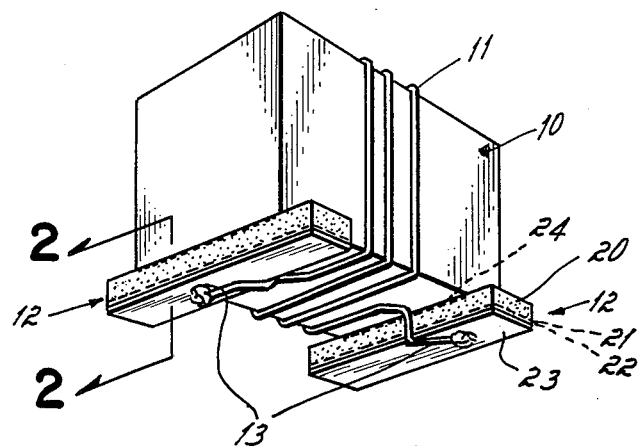

United States Patent [19]

Chamberlin

[11] Patent Number: 4,725,806

[45] Date of Patent: Feb. 16, 1988

[54] CONTACT ELEMENTS FOR MINIATURE INDUCTOR

[75] Inventor: Edward R. Chamberlin, Loveland, Ohio

[73] Assignee: Standex International Corporation, Salem, N.H.

[21] Appl. No.: 52,070

[22] Filed: May 21, 1987

[51] Int. Cl.⁴ ............................................. H01F 15/10
[52] U.S. Cl. ..................................... 336/192; 361/405
[58] Field of Search ...................... 361/400, 403, 405; 338/322, 328; 336/192, 65

[56] References Cited

U.S. PATENT DOCUMENTS

| | | | |
|---|---|---|---|
| 3,550,228 | 12/1970 | Asscher | 361/405 X |
| 3,585,553 | 6/1971 | Muckelroy et al. | 336/192 |
| 4,149,135 | 4/1979 | Roespel et al. | 336/192 X |
| 4,314,221 | 2/1982 | Satou et al. | 336/192 X |
| 4,588,974 | 5/1986 | Hill | 336/192 |

Primary Examiner—Thomas J. Kozma
Attorney, Agent, or Firm—Wood, Herron & Evans

[57] ABSTRACT

A miniature inductor having strips of printed circuitboard material forming contact elements for surface mounting the inductor to a printed circuitboard.

5 Claims, 2 Drawing Figures

CONTACT ELEMENTS FOR MINIATURE INDUCTOR

This invention relates to miniature inductors and particularly to the securing of contact elements on the inductor so that the inductor can be surface mounted to a printed circuitboard.

The inductor consists of a ferromagnetic core, a winding around the core, and contact elements to which the ends of the winding are soldered. That inductor is surface mounted to the copper pattern side of a printed circuitboard. The inductors to which the present invention is directed are tiny, having a maximum dimension of about 1/10 inch.

U.S. Pat. No. 4,588,974, assigned to the assignee of the present invention, discloses a mounting of contact elements to an inductor core. In that patent, the elements are shallow, U-shaped copper strips whose legs are clamped against the sides of the core to hold the copper to the core until the epoxy adhesive sets. U.S. Pat. No. 4,588,974 has not provided the best solution to the attachment problem. The attachment has not been completely reliable because the epoxy does not bond well to the copper, the copper having a thin film of copper oxide to which the epoxy does not bond well. Further, from an electrical standpoint, the close proximity of all of that copper to the core and winding adversely affects the Q of the inductor. The problem of attachment arises particularly in the mass producing of tiny inductors wherein the copper contacts having dimensions of about 0.020 inch by 0.070 inch are to be bonded to the core. Because of the difficulty of adhering epoxy to copper, that surface area simply is too small to make a good, reliable bond. If the contact elements were made with a larger bonding area to make a better atachment, too much copper would be introduced and positioned too close to the winding, with the result that the Q degrades.

An objective of the present invention has been to provide a mounting of a contact element to a miniature inductor that provides a good bond and significantly improves the Q of prior configurations. This objective is attained by using conventional printed circuitboard material as a contact element. The printed circuitboard material is a laminate of an impregnated fabric such as fiberglass forming a base and copper with tin plating covering the exposed surface of the copper. The preferred material is thin, being about 0.010 inch in thickness with the base being about 0.007 inch thick and the copper being from 0.001 inch to 0.003 inch thick. The base could be up to about 0.030 inch thick.

In the forming of sheets of printed circuitboard material, it is possible to apply processing techniques by which a very good adherence between the base material and the copper is attained—that is, an adherence that cannot be attained when one is attempting to mass produce tiny little contact strips mounted to tiny core members. Epoxy is relatively easy to adhere to another epoxy-based material such as fiberglass board. Thus, the use of printed circuitboard material, which has an epoxy-impregnated base, solves the adherence problem since the tiny contact elements formed of that material can be bonded by the epoxy to the core with relative ease. But there is an additional benefit arising out of the use of the printed circuitboard material in that the 7 mil thick fiberglass acts as a spacer of the copper away from the winding on the core, thereby improving the Q by a factor of 5-10%.

Figure 2:
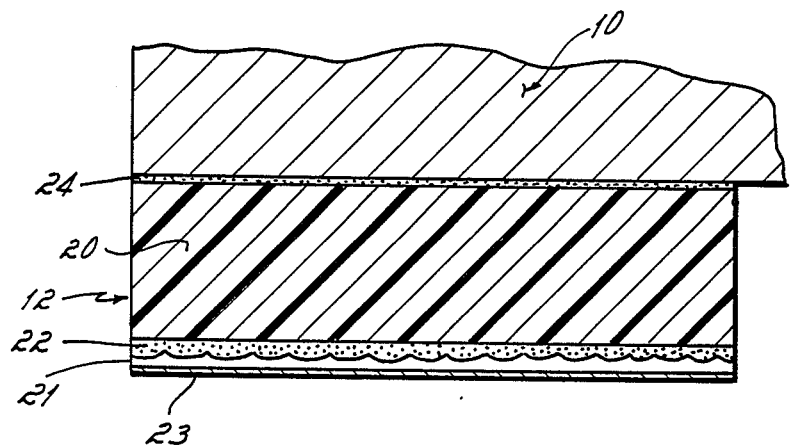

The several features and objectives of the present invention will become more readily apparent from the following detailed description taken in conjunction with the accompanying drawings in which:

FIG. 1 is a perspective view of an inductor and formed in accordance with the present invention; and FIG. 2 is a cross-sectional view taken along lines 2—2 of FIG. 1.

Referring to FIG. 1, there is shown a core 10 around which a winding 11 is mounted. Contact elements 12 are secured to the core. The winding has ends 13 that are soldered to the contact elements. That inductor is suitable for surface mounting to the copper pattern of a printed circuitboard by soldering the contact elements to the copper on the printed circuitboard.

The inductor is tiny. It has dimensions which will be set forth below. These dimensions will vary somewhat but are set forth here to provide the order of magnitude of size of inductor to which the present invention is applicable. The core is 0.100 to 0.250 inch long, 0.090 to 0.200 inch wide, and 0.050 to 0.150 inch high. The spacing between the contact elements 12 is about 0.060 inch. Each contact element is about 0.020 inch wide and 0.070 inch to 0.200 inch long.

As best shown in FIG. 2, the contact element 12 is formed from a laminate of an epoxy base fiberglass fabric 20 which is about 0.007 inch thick and copper 21 that is between 0.001 inch and 0.003 inch thick. The copper is bonded to the fiberglass by an adhesive 22 in accordance with the conventional practices in making printed circuitboard material. The copper is usually clad with a tin plate indicated at 23.

Each contact element 12 is attached to the core 10 by means of an epoxy 24.

It can be seen from FIG. 2 that the 0.007 inch base material spaces the copper strip 21 a substantial distance away from the core and the winding, thereby improving the Q of the inductor.

From the above disclosure of the general principles of the present invention and the preceding detailed description of a preferred embodiment, those skilled in the art will readily comprehend the various modifications to which the present invention is susceptible. Therefore, I desire to be limited only by the scope of the following claims and equivalents thereof.

I claim:

1. In an inductor having a core having a base surface, and
   a winding on said core having ends adjacent said base surface, an adhesive on said core mounting contact elements at each end of said core, comprising:
   an epoxy-based board with fiberglass or other fabric spacer forming a base bonded to said adhesive, and
   a copper strip bonded to said spacer.

2. An inductor as in claim 1 and a tin plate on the surface of said copper strip.

3. An inductor as in claim 1 in which the dimension of said core is 0.100 inch to 0.250 inch long.

4. An inductor as in claim 1 in which the dimension of said core is 0.100 inch to 0.250 inch, the base is 0.007 inch to 0.030 inch thick and the copper is about 0.003 inch thick.

5. An inductor as in claim 4 in which said contact elements are about 0.020 inch wide and are spaced apart by about 0.060 inch.

* * * * *

UNITED STATES PATENT AND TRADEMARK OFFICE
CERTIFICATE OF CORRECTION

PATENT NO. : 4,725,806

DATED : February 16, 1988

INVENTOR(S) : Edward R. Chamberlin

It is certified that error appears in the above-identified patent and that said Letters Patent is hereby corrected as shown below:

Column 2, line 53, after core," insert -- the improvement --

Signed and Sealed this

Twenty-third Day of August, 1988

*Attest:*

DONALD J. QUIGG

*Attesting Officer*     *Commissioner of Patents and Trademarks*